United States Patent
Dangelmaier et al.

(10) Patent No.: US 11,239,176 B2
(45) Date of Patent: Feb. 1, 2022

(54) PACKAGE COMPRISING IDENTIFIER ON AND/OR IN CARRIER

(71) Applicant: Infineon Technologies AG, Neubiberg (DE)

(72) Inventors: Jochen Dangelmaier, Beratzhausen (DE); Klaus Elian, Alteglofsheim (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 16/835,627

(22) Filed: Mar. 31, 2020

(65) Prior Publication Data

US 2020/0335451 A1   Oct. 22, 2020

(30) Foreign Application Priority Data

Apr. 17, 2019   (DE) ..................... 10 2019 110 191.3

(51) Int. Cl.
*H01L 23/544* (2006.01)
*H01L 23/495* (2006.01)

(52) U.S. Cl.
CPC ...... *H01L 23/544* (2013.01); *H01L 23/49548* (2013.01); *H01L 23/49582* (2013.01); *H01L 2223/5442* (2013.01); *H01L 2223/54406* (2013.01); *H01L 2223/54433* (2013.01); *H01L 2223/54473* (2013.01); *H01L 2223/54486* (2013.01)

(58) Field of Classification Search
CPC ... H01L 23/544; H01L 2223/544–5442; H01L 2223/54433; H01L 2223/54473; H01L 2223/54486
See application file for complete search history.

(56) References Cited

U.S. PATENT DOCUMENTS

| | | | |
|---|---|---|---|
| 7,157,131 B1 | 1/2007 | Blish, II et al. | |
| 2003/0129836 A1* | 7/2003 | Sato | H01L 23/544 438/689 |
| 2005/0285278 A1 | 12/2005 | Grigg et al. | |
| 2006/0145324 A1 | 7/2006 | Boyd | |
| 2011/0298116 A1* | 12/2011 | Mizusaki | H01L 21/6835 257/676 |
| 2012/0298198 A1 | 11/2012 | van Krevel et al. | |
| 2016/0351508 A1 | 12/2016 | Kalyanaraman et al. | |
| 2017/0025366 A1 | 1/2017 | Marchetto et al. | |

FOREIGN PATENT DOCUMENTS

| | | | | |
|---|---|---|---|---|
| EP | 3361504 A1 * | 8/2018 | ........... | H01L 23/544 |
| JP | 04080949 A * | 3/1992 | | |
| JP | 05036739 A * | 2/1993 | | |
| JP | 2007258639 A * | 10/2007 | | |
| JP | 2009194321 A * | 8/2009 | ........... | H05K 1/0266 |

* cited by examiner

*Primary Examiner* — Zandra V Smith
*Assistant Examiner* — Molly K Reida
(74) *Attorney, Agent, or Firm* — Dicke, Billig & Czaja, PLLC

(57) ABSTRACT

A package comprising a carrier, an electronic component mounted on the carrier, and an identifier indicative of an origin of the package and being formed on and/or in the carrier is disclosed.

21 Claims, 4 Drawing Sheets

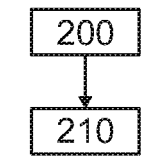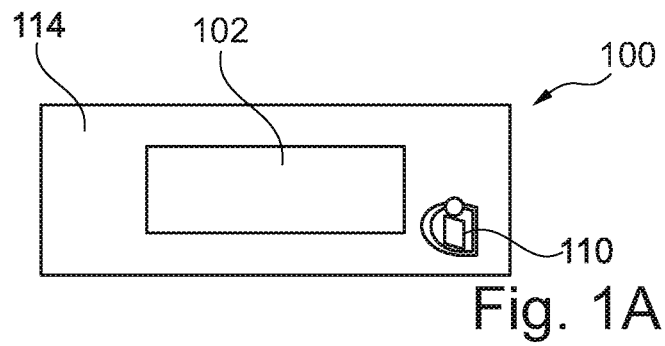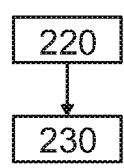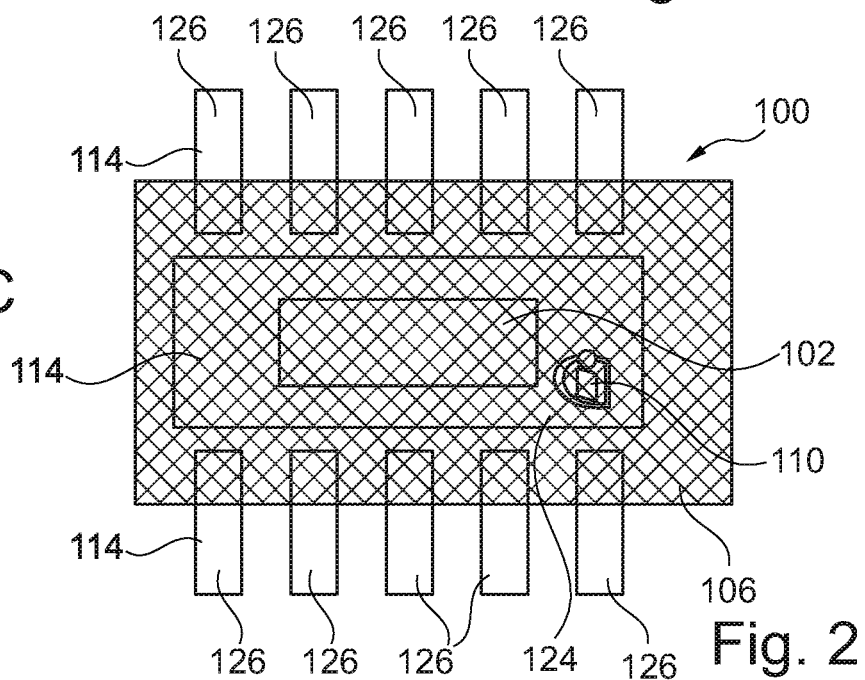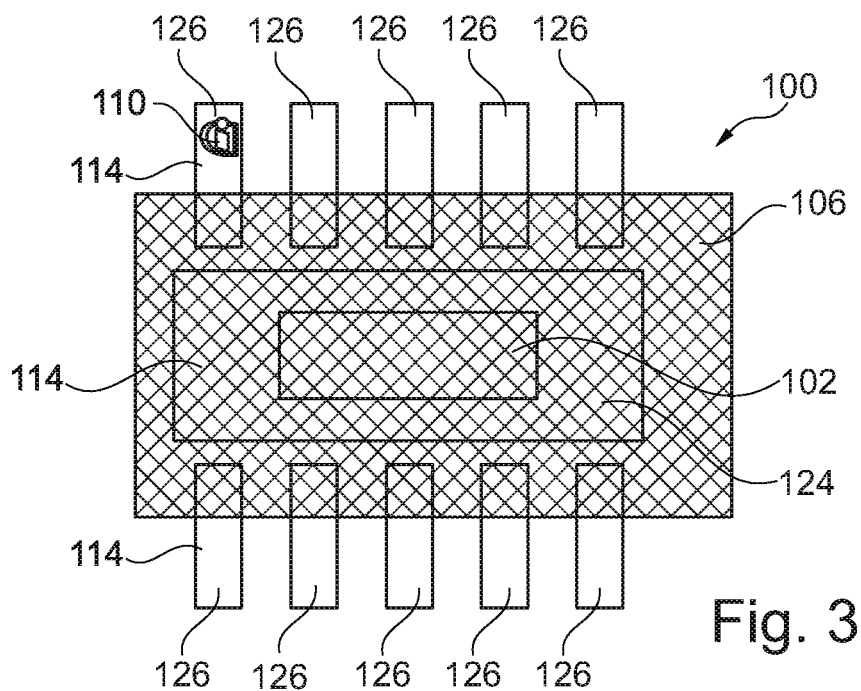

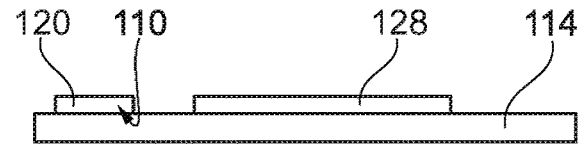
Fig. 4
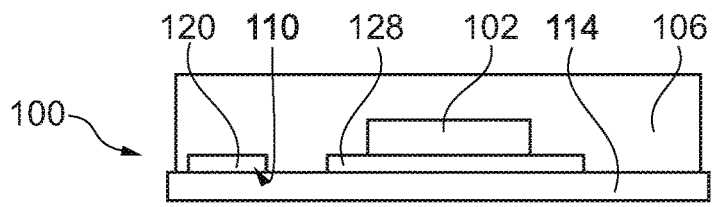
Fig. 5
Fig. 6
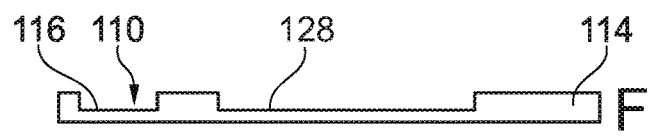
Fig. 7
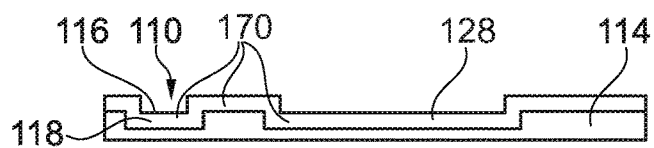
Fig. 8
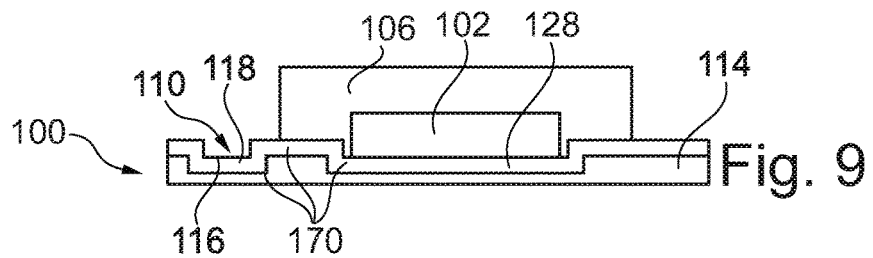
Fig. 9
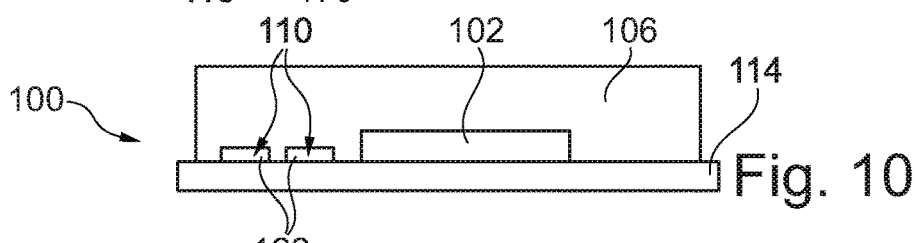
Fig. 10
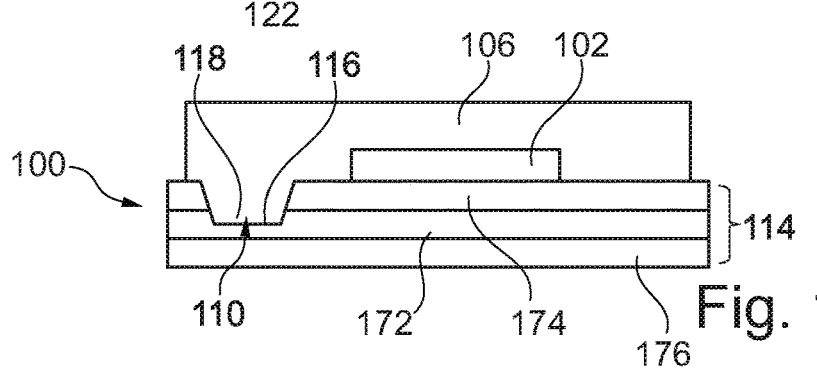
Fig. 11

PACKAGE COMPRISING IDENTIFIER ON AND/OR IN CARRIER

CROSS-REFERENCE TO RELATED APPLICATION

This Utility patent application claims priority to German Patent Application No. 10 2019 110 191.3, filed Apr. 17, 2019, which is incorporated herein by reference.

BACKGROUND

The present a invention relates to a package, a method of manufacturing a package, and a method of determining an origin of a package.

A package may comprise an electronic component, such as a semiconductor chip, mounted on a carrier, such as a leadframe. Packages may be embodied as encapsulated electronic component mounted on a carrier with electrical connects extending out of the encapsulant and being coupled with an electronic periphery.

However, packages suffer from plagiarism. Counterfeit packages may have an insufficient quality and reliability and may therefore cause severe danger during operation of the package. This is in particular critical in safety related fields, for instance for packages used for automotive applications, aircraft applications or medical applications.

SUMMARY

There may be a need to manufacture a package in a simple and forgery-proof manner.

According to an exemplary embodiment, a package is provided which comprises a carrier, at least one electronic component mounted on the carrier, and an identifier indicative of an origin of the package and being formed on and/or in the carrier.

According to another exemplary embodiment, a method of manufacturing a package is provided, wherein the method comprises mounting at least one electronic component on a carrier, and forming an identifier indicative of an origin of the package on and/or in the carrier.

According to yet another exemplary embodiment, a method of determining an origin of a package having the above-mentioned features is provided, wherein the method comprises detecting data from the identifier on and/or in the carrier, and identifying the origin of the package by evaluating the detected data (for example by comparing the detected data with reference data stored in a database).

According to an exemplary embodiment, an identifier characterizing the identity or origin of a package may be formed on and/or in a carrier. By forming the identifier on the carrier, there is substantially no additional effort for forming the identifier, because the carrier needs to be there anyway for carrying the electronic component. In many cases, the carrier itself is processed during the manufacturing procedure of a package, so that the parallel formation of an identifier on and/or in the carrier can be possible substantially without additional effort. Furthermore, the (in many cases at least partially metallic) carrier is appropriate for forming the identifier thereon and/or therein, because such an identifier cannot be easily removed by plagiarism, so that it may be ensured that the identifier being indicative of the origin of the package can remain permanently part of the package. Therefore, a forgery-proof package guaranteeing a genuine origin is provided, which increases the safety of operation due to a guaranteed quality and reliability connected with the indicated origin. Failure and safety issues caused by inappropriate plagiarism packages may therefore be safely prevented.

BRIEF DESCRIPTION OF THE DRAWINGS

The accompanying drawings, which are included to provide a further understanding of exemplary embodiments of the invention and constitute a part of the specification, illustrate exemplary embodiments of the invention.

In the drawings:

FIG. 1A illustrates a plan view of a package according to an exemplary embodiment.

FIG. 1B illustrates a block diagram of a method of manufacturing a package according to an exemplary embodiment.

FIG. 1C illustrates a block diagram of a method of determining an origin of a package according to an exemplary embodiment.

FIG. 2 illustrates a cross-sectional view of a package according to another exemplary embodiment.

FIG. 3 illustrates a cross-sectional view of a package according to still another exemplary embodiment.

FIG. 4 to FIG. 6 illustrate cross-sectional views of structures obtained during manufacturing a package, shown in FIG. 6, according to an exemplary embodiment.

FIG. 7 to FIG. 9 illustrate cross-sectional views of structures obtained during manufacturing a package, shown in FIG. 9, according to another exemplary embodiment.

FIG. 10 illustrates a cross-sectional view of a package according to another exemplary embodiment.

FIG. 11 illustrates a cross-sectional view of a package according to still another exemplary embodiment.

DETAILED DESCRIPTION

Figure 12:
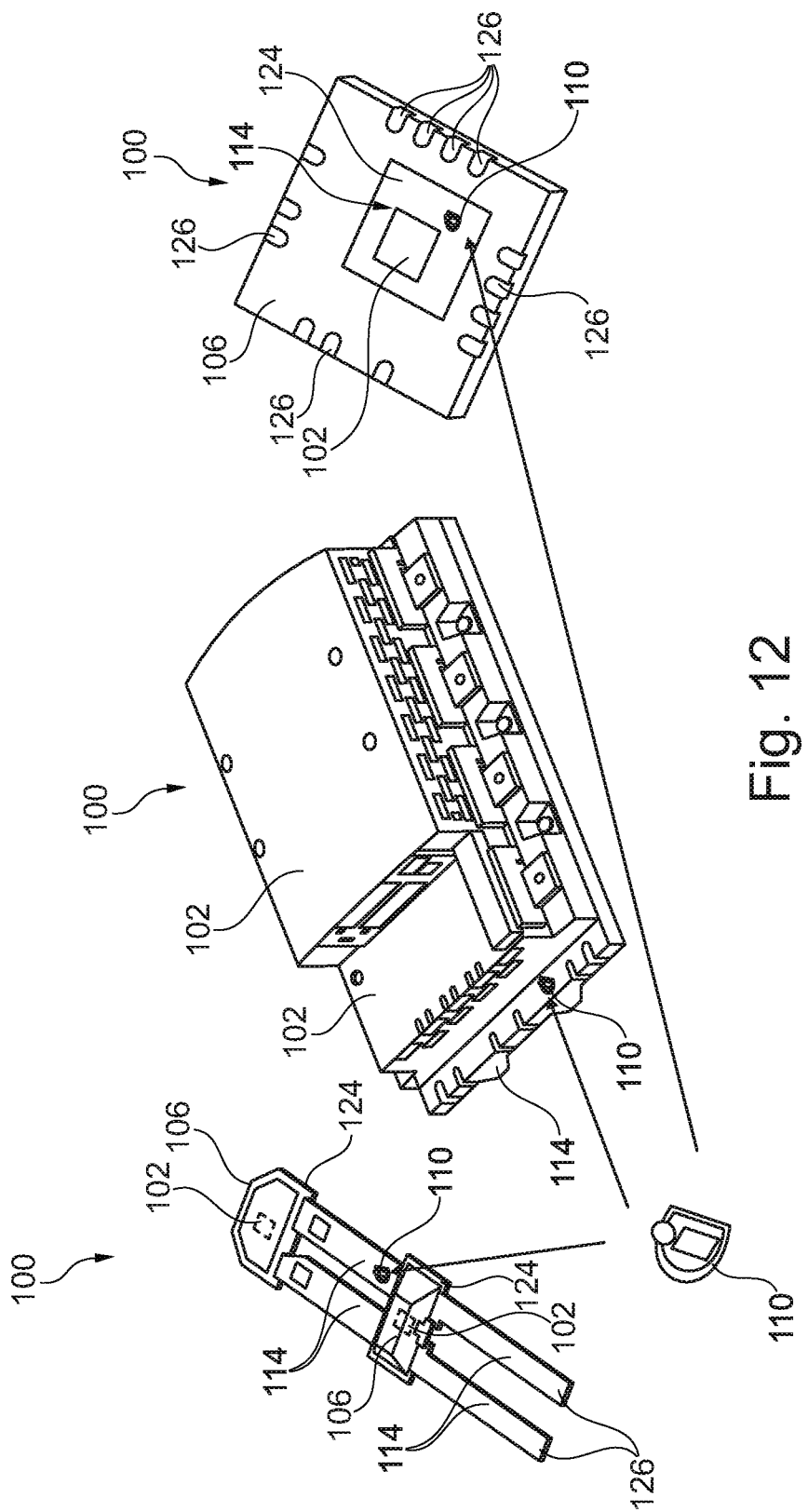
FIG. 12 illustrates a three-dimensional view of packages according to other exemplary embodiments.

In the following, further exemplary embodiments of the package and the methods will be explained.

In the context of the present application, the term "package" may particularly denote an electronic device comprising one or more electronic components mounted on a carrier and optionally packaged using an encapsulant. Further optionally, one or more electrically conductive contact elements (such as bond wires or clips) may be implemented in a package, for instance for electrically coupling the electronic component with the carrier.

In the context of the present application, the term "electronic component" may in particular encompass a semiconductor chip (in particular a power semiconductor chip), an active electronic device (such as a transistor), a passive electronic device (such as a capacitance or an inductance or an ohmic resistance), a sensor (such as a microphone, a light sensor or a gas sensor), an actuator (for instance a loudspeaker), and a microelectromechanical system (MEMS). In particular, the electronic component may be a semiconductor chip having at least one integrated circuit element (such as a diode or a transistor) in a surface portion thereof. The electronic component may be a naked die or may be already packaged or encapsulated.

In the context of the present application, the term "carrier" may particularly denote a support structure (preferably, but not necessarily electrically conductive) which serves as a mechanical support for the one or more electronic components, and which may also contribute to the electric interconnection between the electronic component(s) and the periphery of the package. In other words, the carrier may fulfil a mechanical support function and an electric connection function.

In the context of the present application, the term "identifier" may particularly denote any physical feature provided on and/or in the carrier and indicating to which company, manufacturer or manufacturing site a package belongs. For instance, such a feature may be permanently formed on and/or in the carrier so as to be irremovable without damaging or destroying the package.

A gist of an exemplary embodiment is the provision of an identifier on a carrier of a package so that the latter is safely protected against plagiarism. According to an exemplary embodiment, a package and a manufacturing method for manufacturing such a package may be provided, wherein the package is provided with an identifier, such as for example an embossed company logo, (preferably directly and exclusively) on a carrier for an electronic component. Preferably, such a carrier may comprise one or more metal parts which may be used as a location for the identifier and which make it difficult for plagiarism to remove or substitute the identifier. Thus, a (in particular semiconductor) package with plagiarism protection is provided. This may be achieved for instance by equipping the package with a unique enclosed marking of the (in particular semiconductor chip) carrier.

Protection measures against plagiarism are difficult, as plagiarism experts have a broad variety of methods for re-working and remarking electronic component packages. Simply marking the electronic component of a package by an original manufacturer might be possible, but this can be only be seen with high effort. Markings which are applied conventionally on a package can be easily removed and replaced by different markings.

In contrast to such conventional approaches, exemplary embodiments provide a significantly more reliable protection against plagiarism by forming (for instance embossing or etching) an identifier (in particular in a three-dimensional pattern) in visible or detectable metal parts of a carrier (such as a leadframe) of the (in particular semiconductor) package. Such three-dimensional patterns or other structures formed on and/or in a carrier for carrying one or more electronic components (such as semiconductor chips) cannot be easily removed or be modified without damaging the package itself. As a result, a user of the package may obtain in a simple way a clear information that a certain package is an original semiconductor product with the guaranteed quality. This secures the functionality of an electronic system for which the package is implemented. More specifically, a semiconductor package may be provided with an embossed company logo on a metal part of a carrier of the package. Advantageously, it is possible to provide the additional functionality of a plagiarism protection without any additional effort, when the functionality of plagiarism protection is already considered at a very early development upfront a final definition of the leadframe stamping tools. Advantageously, the identifier can be detected very easily. Thus, the origin of the package may be determined in a very simple way by just looking at the package or by carrying out a straightforward detection, such as an X-ray detection.

In an embodiment, the package comprises a plurality of electronic components mounted on the carrier. Thus, the package may comprise one or more electronic components (for instance at least one passive component, such as a capacitor, and at least one active component, such as a semiconductor chip).

In an embodiment, the identifier is a three-dimensional structure. When the identifier is a three-dimensional structure (such as a surface profile in a corresponding portion of the carrier), it can be removed from the package only by destroying the carrier and thus the package, since the three-dimensional structure in a (in particular metallic) part of the package cannot be easily removed.

In an embodiment, the identifier comprises or consists of an indentation (such as a recess, through hole, etc.) in the carrier. Such an indentation may be formed in the carrier by selectively removing a portion of material from the carrier, so that the remaining indentation includes the information about the origin of the package.

In an embodiment, the package comprises a filling medium at least partially filling the indentation, in particular additionally filling at least the surrounding portion of the indentation. When the indentation is at least partially filled with material, for instance by plating additional metallic material on a metallic carrier being provided with an indentation, an even more complex structure is formed which is difficult to be removed or substituted and cannot be imitated in a simple way by plagiarism.

In an embodiment, the identifier comprises or consists of a protrusion protruding beyond the carrier (in particular protruding beyond a planar surface portion of the carrier). Such a protrusion may be formed by selectively adding material in a specific pattern in a certain surface region of the carrier so as to form the identifier for characterizing the origin of the package. Forming a protrusion in the carrier may also be accomplished by correspondingly bending or metal forming a planar carrier.

In an embodiment, the identifier comprises or consists of at least one separate body attached to the carrier, for instance made of a material being different from a material of the carrier. Adding one or more bodies to a specific portion of the carrier, in particular to a portion covered by an encapsulant, provides an identifier for the package which is very difficult to remove and very simple to be formed. In order to remove such an identifier, it would be necessary to firstly remove the encapsulant and then remove the one or more bodies from the surface of the carrier. This involves a significant effort and the risk that at least part of the package is destroyed or damaged.

In an embodiment, the carrier comprises a leadframe, in particular comprising a die pad and a plurality of leads. Such a leadframe may be a sheet-like metallic structure which can be patterned so as to form one or more die pads or mounting sections for mounting the one or more electronic components of the package, and one or more lead sections for an electric connection of the package to an electronic environment when the electronic component(s) is/are mounted on the leadframe. In an embodiment, the leadframe may be a metal plate (in particular made of copper) which may be patterned, for instance by stamping or etching. Forming the chip carrier as a leadframe is a cost-efficient and mechanically as well as electrically advantageous configuration in which a low ohmic connection of the at least one electronic component can be combined with a robust support capability of the leadframe. Furthermore, a leadframe may contribute to the thermal conductivity of the package and may remove heat generated during operation of the electronic component (s) as a result of the high thermal conductivity of the metallic (in particular copper) material of the leadframe. A leadframe may comprise for instance aluminum and/or copper. In the context of the present application, the term "die pad" may particularly denote a portion of a leadframe being shaped and dimensioned for accommodating an electronic component such as a semiconductor chip. Correspondingly, the surface area of the die pad is usually flat and planar and sufficiently large for fully receiving the chip or die thereon. In contrast to this, the term "leads" may particularly denote another portion of a leadframe which may at least partially extend beyond an encapsulant (if present) and serves as connection element to an electronic periphery of the package. It is for instance possible that one or more terminals of the electronic component mounted on the die pad is or are electrically connected to a respective one of the leads, for instance by a clip, bond wire or bond ribbon. It is for instance possible that the die pad is encapsulated and the leads are partially or entirely exposed with regard to an encapsulant. It is also possible that the die pad forms a central portion of a leadframe type carrier, whereas the leads may form a peripheral portion of the leadframe. Both die pads and leads may at least partially comprise a metallic material. More generally, the carrier may be a partially or entirely metallic structure.

In an embodiment, the identifier is formed on and/or in the die pad or on and/or in at least one of the plurality of leads. Forming the identifier on a die pad provides the advantage that the identifier is usually covered by an encapsulant so as to be removable by plagiarism only with high effort and by destroying the package. Forming the identifier at the leads may allow a very simple detection of the origin of the package by simply optically inspecting the identifier on the lead being exposed with regard to an encapsulant.

In another embodiment, the carrier comprises at least one of the group consisting of a ceramic substrate, a stack composed of a central electrically insulating and thermally conductive layer (such as a ceramic layer) covered on both opposing main surfaces by a respective electrically conductive layer (such as a copper layer or an aluminum layer, wherein the respective electrically conductive layer may be a continuous or a patterned layer), a Direct Copper Bonding (DCB) substrate, and a Direct Aluminum Bonding (DAB) substrate. While many different carriers may be used with different embodiments, it may be preferred that the identifier is formed on and/or in a metallic portion or surface of the carrier so as to be removable or manipulatable only with high effort, and preferably not without destroying the package. This provides a safe indication of the origin of the package.

In an embodiment, the identifier is indicative of at least one of the group consisting of a manufacturer of the package, and a manufacturing lot to which the package belongs. Thus, the identifier may indicate directly the identity of a manufacturing company of the package. Thus, a user may be sure to which company a corresponding package belongs. This may ensure a proper quality and reliability of the package. However, it is also possible that the information on the identifier indicates to which lot (i.e. set or batch of packages) a presently monitored package belongs, i.e. when and where the package has been manufactured. In case of quality issues, it is therefore possible to unambiguously retrace the manufacturing time and site of this individual identifier. More generally, the identifier may be unique for a specific package or lot of packages, or may be identical for all packages originating from the same manufacturing company.

In an embodiment, the identifier comprises at least one of the group consisting of an alphanumerical code, a logo, and a machine-readable code. Thus, the code may be a company logo which clearly indicates to a user to which company the package belongs. Alternatively, it is possible that a sequence of letters and/or numbers indicates an origin, for instance indicates a company name or product number. It is however also possible that the inspection of the identifier only indirectly allows deriving information concerning the origin, for instance when the identifier is a machine-readable code such as a barcode or a QR code. In such an event, reading the machine-readable code and accessing a corresponding database may allow deriving the origin of the package.

In an embodiment, the identifier is located on and/or in the carrier in such a way that the identifier is readable, in particular human-readable and/or machine-readable, from an exterior of the package. Correspondingly, detecting the identifier may comprise a visual inspection by a user, and/or a machine inspection by a detection device, in particular an X-ray detection device. When the identifier is formed on a portion of the carrier which is exposed in a readily manufactured product, simply looking onto the package allows a user to derive information about the company to which the package belongs. In another embodiment, the identifier may be located below an encapsulant or the like but may nevertheless be read, for instance by X-ray inspection, etc. In both cases, it is possible to unambiguously derive information about the identity or origin of the package without destroying or damaging the latter.

In an embodiment, the identifier and/or at least a portion of the carrier on and/or in which the identifier is formed comprises or consists of a metal. Thus, the carrier may comprise or consist of a metallic material. The identifier may be formed on and/or in metallic material of the carrier. This renders the counterfeit protection particularly safe and difficult to overcome, since removing an identifier from a metallic portion is very difficult without destroying the package.

In an embodiment, the package comprises an encapsulant at least partially encapsulating the electronic component. In the context of the present application, the term "encapsulant" may particularly denote a substantially electrically insulating and preferably thermally conductive material surrounding (for example hermetically surrounding) an electronic component and optionally part of a carrier to provide mechanical protection, electrical insulation, and optionally a contribution to heat removal during operation. Such an encapsulant can be, for example, a mold compound. When encapsulating by molding, injection molding or transfer molding may be carried out, for example. Hence, the encapsulant may comprise a mold, in particular a plastic mold. For instance, a correspondingly encapsulated body (in particular electronic component with carrier) may be provided by placing the body or bodies between an upper mold tool and a lower mold tool and to inject liquid mold material therein. After solidification of the mold material, formation of the encapsulant is completed. If desired, the mold may be filled with particles improving its properties, for instance its heat removal properties. In other exemplary embodiments, the encapsulant may also be a laminate or a casting component.

In an embodiment, the identifier is located outside of the encapsulant. Thus, it is possible to locate the identifier outside of the encapsulant which allows a user to visually inspect the identifier without any technical assistance.

In another embodiment, the identifier is encapsulated within the encapsulant. When the identifier is located on and/or in the carrier but encapsulated by an encapsulant, it is extremely difficult, without the risk of damage, to remove the encapsulant by an unauthorized entity for removing the identifier and optionally substituting it by a plagiarism logo or the like. Thus, locating the identifier below an encapsulant in a however still readable way allows a particularly safe counterfeit protection.

In an embodiment, the method comprises forming a functional structure on and/or in the carrier at least partially (in particular entirely) simultaneously with the forming of the identifier. In the context of the present application, the term "functional structure" may particularly denote any feature of the package which contributes to the technical function of the package. For instance, such a feature may contribute to the mounting of the electronic component on the carrier, may promote adhesion between the carrier and an encapsulant, may contribute to an electric connection of the electronic component, etc. By forming the functional structure and the identifier partially or entirely simultaneously, it is possible to form the identifier substantially without any additional effort and therefore in a very simple way. For instance, deposition of a material being used in terms of package functionality (for instance as adhesion promoter) in one region of the carrier may be used for forming a protrusion constituting the identifier in another region of the carrier. Etching a functional structure (for instance for forming a recess in the carrier in which recess the electronic component is to be inserted for mounting) may be done simultaneously with the formation of an indentation type identifier. Plating a metal as part of a functionality of the package (for instance for reducing ohmic resistance) may at least partially fill an indentation type identifier. Attaching functional bodies may be done substantially simultaneously with the attachment of additional bodies forming at least part of the identifier.

Additionally or alternatively to the previously described embodiment, the method may comprise forming the identifier to simultaneously function as a functional structure. Thus, the identifier may be formed so that it fulfils a double function, i.e. identifying an origin of the package and providing one additional function in the framework of the package. For instance, the identifier may be manufactured with such a surface profile so as to indicate the origin of the package and to promote a mechanical interlocking with encapsulant material to thereby promote adhesion between carrier and encapsulant. For instance, functional structures (such as dimples, micro dimples, grooves, etc.) may be used as mechanical adhesion promoter. A company logo or another identifier can also be used for mechanical interlocking or as delamination stop from outside or avoid delamination towards outside.

In an embodiment, forming the identifier comprises at least one of the group consisting of embossing, stamping, etching, laser processing, depositing, plating, patterning, and three-dimensionally printing. Thus, many different manufacturing procedures being properly compatible with package manufacturing may be used for forming the identifier. In particular, one of the mentioned manufacturing procedures for forming the identifier may be used as well for forming at least one other functional structure of the package.

In an embodiment, the electronic component is mounted on the carrier by at least one of the group consisting of a solder structure, a sinter structure, a welding structure, or a glue structure. Thus, mounting the electronic component on the carrier may be accomplished by soldering, sintering or welding, or by adhering or gluing.

In an embodiment, the carrier is configured as a bulk structure for mechanically supporting the mounted electronic component and/or for electrically contacting the mounted electronic component. Thus, the carrier may be a rigid and stable and preferably electrically conductive bulk body serving as mounting base for the separate electronic component.

In an embodiment, the package comprises an electrically conductive connection structure electrically connecting the mounted electronic component with the carrier. For instance, the electrically conductive connection structure may comprise at least one of the group consisting of a clip, a wire bond, and a ribbon bond. A clip may be a three-dimensionally bent plate type connection element which has two planar sections to be connected to an upper main surface of the respective electronic component and an upper main surface of the carrier, wherein the two mentioned planar sections are interconnected by a slanted connection section. As an alternative to such a clip, it is possible to use a wire bond or ribbon bond which is a flexible electrically conductive wire or ribbon shaped body having one end portion connected to the upper main surface of the respective electronic component and having an opposing other end portion being electrically connected to the carrier.

In an embodiment, the at least one electronic component comprises at least one of the group consisting of a controller circuit, a driver circuit, and a power semiconductor circuit. All these circuits may be integrated into one semiconductor chip, or separately in different chips. For instance, a corresponding power semiconductor application may be realized by the chip(s), wherein integrated circuit elements of such a power semiconductor chip may comprise at least one transistor (in particular a MOSFET, metal oxide semiconductor field effect transistor), at least one diode, etc. In particular, circuits fulfilling a half-bridge function, a full-bridge function, etc., may be manufactured.

As substrate or wafer for the semiconductor chips, a semiconductor substrate, i.e. a silicon substrate, may be used. Alternatively, a silicon oxide or another insulator substrate may be provided. It is also possible to implement a germanium substrate or a III-V-semiconductor material. For instance, exemplary embodiments may be implemented in GaN or SiC technology.

The above and other objects, features and advantages of the present invention will become apparent from the following description and the appended claims, taken in conjunction with the accompanying drawings, in which like parts or elements are denoted by like reference numbers.

The illustration in the drawing is schematically and not to scale.

Before exemplary embodiments will be described in more detail referring to the Figures, some general considerations will be summarized based on which exemplary embodiments have been developed.

According to an exemplary embodiment, a carrier for carrying an electronic component of a package is provided with an identifier indicating the origin of the package, thereby providing an efficient protection against plagiarism. More specifically, it is possible in different embodiments to form the identifier by embossing, stamping or etching. By taking this measure, it may be possible to constitute a three-dimensional pattern, as the identifier, in visible metal parts of the carrier of the (in particular semiconductor) package. Such three-dimensional patterns cannot be easily removed or modified without damaging the package itself.

Advantageously, it may be possible to generate such an identifying pattern in the same process during which simultaneously another functional pattern or design of the package is formed. Hereby, the different patterns may have different functions.

For instance, the functional pattern may have the task of enhancing package stability, for instance:

A mechanically structured adhesion promoter as intrusion or protrusion, in particular formed by a two-dimensional or three-dimensional design.

A delamination stopper which may be formed for example at a die pad or a wire pad side of a leadframe type carrier, wherein such a delamination stopper may function from outside to inside and/or from inside to outside.

A bleed stop which may be formed for example on a die pad of a leadframe type carrier towards an edge or around an electronic component such as a chip, wherein such a bleed stop may be configured as glue, solder or another die attach material.

The functional structure may be formed on a die pad of a leadframe type carrier beneath the electronic component (in particular chip) as an intrusion and/or a protrusion for proper die attach material adhesion and/or as bleed stop. (for instance as sort of a pool shaped indentation with a marking inside and/or as an edge of such a pool shaped indentation)

What concerns the identifier pattern, its function is marking of the package for identifying the package origin, for instance by indicating a manufacturing company (for instance with a company logo and/or other information that allows to identify the package as originating from a certain manufacturer).

Both above-mentioned types of patterns may be advantageously manufactured in the same process and preferably simultaneously, to thereby keep the manufacturing effort small.

An advantage of the formation of a three-dimensional pattern as identifier on and/or in the carrier (in particular a metallic region of the carrier) is that such an identifier cannot be removed easily from the package without major damage of package features.

Advantageously, the following process flow may be carried out for forming the identifier integrated into the package manufacturing process:

1. Manufacture or provide the carrier (for instance a substrate such as a leadframe): Such a carrier may contain all necessary patterns, assist structures and the marking structure constituting the identifier.

2. Assemble the electronic component (for instance a semiconductor chip or integrated circuit) on the carrier.

3. Apply plating material (for instance tin) over metal structures of the carrier.

4. Test, trim and singulate preforms of packages.

5. Pack mounted electronic components in corresponding packing material or encapsulant, for instance mold compound.

Procedure 3 ensures that the branding pattern or identifier is arranged below the plating metal. An obtainable advantage is the provision of the additional functionality of a plagiarism protection without any additional effort, since this functionality can be already considered at a very early development upfront definition of the leadframe stamping tools. Each trial of a forger to add a company logo copy at the final package would lead to a plating damage and would be recognizable by simple microscope analysis.

In an embodiment, the package may be configured as a high-power module having screwing and plug connections. A laser marking or the provision of another one of the above mentioned identifier structures can be formed on and/or in the carrier of such a package as well. It may also be possible to provide a defined metallic structure (such as a fine comb) for enabling determination as to whether plugs of the package have already been used before.

FIG. 1A illustrates a plan view of a package 100 according to an exemplary embodiment. The package 100 illustrated in FIG. 1A comprises a carrier 114 and an electronic component 102 mounted on the carrier 114. Furthermore, the package 100 comprises an identifier 110 indicative of an origin of the package 100 and being formed on and/or in the carrier 114.

FIG. 1B illustrates a block diagram of a method of manufacturing a package 100 according to an exemplary embodiment. As illustrated by a block 200, the method comprises the procedure of mounting an electronic component 102 on a carrier 114. As illustrated by block 210, the method further comprises the procedure of forming an identifier 110 indicative of an origin of the package 100 on and/or in the carrier 114.

FIG. 1C illustrates a block diagram of a method of determining an origin of package 100 shown in FIG. 1A according to an exemplary embodiment. As illustrated by a block 220, the method comprises the procedure of detecting data from the identifier 110 on and/or in the carrier 114. As illustrated by block 230, the method further comprises the procedure of identifying the origin of the package 100 by evaluating the detected data. For instance, this may be accomplished by comparing the detected data with reference data stored in a database (not shown).

FIG. 2 illustrates a cross-sectional view of a package 100 according to another exemplary embodiment.

The package 100 according to FIG. 2 comprises a leadframe type carrier 114 consisting of metal, for instance copper. Said leadframe comprises a substantially rectangular central die pad 124 shaped and dimensioned for mounting a semiconductor die type electronic component 102 thereon. Moreover, the leadframe type carrier 114 comprises a plurality of leads 126 being located peripherally with regard to the die pad 124 and extending parallel to one another. More specifically, two groups of parallel leads 126 extend from but spaced with regard to two opposing long sides of the substantially rectangular die pad 124 outwardly.

The electronic component 102 is mounted, for instance soldered, on the die pad 124 of the carrier 114 and can be a semiconductor chip such as a naked die. For instance, the electronic component 102 may be a power semiconductor chip comprising an integrated transistor with vertical current flow.

Although not shown in FIG. 2, it is possible that one or more terminals of the electronic component 102 are electrically coupled with respective ones of the leads 126 by one or more electrically conductive connection elements, such as bond wires, bond ribbons or clips.

In the embodiment of FIG. 2, the identifier 110 being indicative of an origin of the package 100 and being formed as part of the carrier 114 is a three-dimensional structure extending out of the paper plane of FIG. 2. Thus, the identifier 110 constitutes a surface profile, elevated contour or relief of the planar sheet-like die pad 124 of carrier 114. For instance, the identifier 110 may be formed on and/or in the carrier 114 by embossing, stamping, etching, laser treatment, depositing, plating, patterning and/or three-dimensionally printing. In the shown embodiment, the identifier 110 is a company logo indicative of a manufacturer of the package 100. Additionally or alternatively, it is also possible that the identifier 110 is indicative of a lot or batch number to which the package 100 belongs.

The package 100 of FIG. 2 comprises a mold type encapsulant 106 which completely encapsulates the electronic component 102 and the die pad 124. It is also shown in FIG. 2 that the encapsulant 106 partially encapsulates and partially exposes the leads 126. The identifier 110 is arranged on a portion of the die pad 124 which is encapsulated within the encapsulant 106. Thus, the described embodiment realizes the marking or identifier 110 on carrier metal inside the encapsulant 106. By marking inside of the encapsulant 106 of the package 100, the identifier 110 is visible by X-ray inspection and is substantially irremovable without damaging package 100. The location of the identifier 110 on the die pad 124 of the carrier 114 allows it to be read by an X-ray machine from an exterior of the package 100.

In particular, it may be possible to emboss a manufacturing company logo on the die pad 124 (or additionally or alternatively on one or more of the leads 126, compare FIG. 3) during a leadframe manufacturing process. It may then also be possible to perform plating over the embossed pattern within the package manufacturing flow (compare for example FIG. 8). An advantage of such a procedure is that it is possible to identify if the identifier 110 is the original embossed pattern or has been added afterwards over the plating. More specifically, forming the identifier 110 by embossing inside the package 100 has the advantage that it is possible to easily identify if this is an original package product by X-ray analysis. Thus, the manufacturing company logo (or another unique marking) as identifier 110 can be applied by a selective metal layer. This can be done during leadframe manufacturing without additional effort, if a manufacturing company uses selective plating for bonding areas (die bonding and wire bonding).

FIG. 2 thus shows that the identifier 110 is formed on a copper surface of the die pad 124 of the leadframe type carrier 114. By subsequently encapsulating electronic component 102 together with the identifier 110 on the die pad 124 may allow protecting the identifier 110 within encapsulant 106 while still allowing to read the encapsulated identifier 110 by X-ray inspection or the like.

FIG. 3 illustrates a cross-sectional view of a package 100 according to still another exemplary embodiment.

As shown in FIG. 3, the identifier 110 is formed on one of the plurality of leads 126. In contrast to FIG. 2, the identifier 110 is located outside of the encapsulant 106 in the embodiment of FIG. 3.

Thus, the embodiment of FIG. 3 accomplishes marking outside of the encapsulant 106 of the package 100, visible by for instance solder residues. Hence, the described embodiment realizes the marking or identifier 110 on carrier metal outside of the encapsulant 106. By marking outside of the encapsulant 106 of the package 100, the identifier 110 can be identified by visual inspection by a human user.

An advantage of embossing the identifier 110 at a solder position of the leads 126 is that solder residues of a previously mounted electronic component 102 may remain at the embossing profile.

FIG. 3 differs from FIG. 2 in that, according to FIG. 3, the identifier 110 is formed on an exposed lead 126 of the leadframe type carrier 114 consisting of copper material. Thus, a user may simply visually inspect the exposed identifier 110. Since the identifier 110 is formed (by embossing or the like) permanently on the lead 126, it is very difficult to remove the identifier 110 also according to FIG. 3 without damaging the package 100.

FIG. 4 to FIG. 6 illustrate cross-sectional views of structures obtained during manufacturing a package 100, shown in FIG. 6, according to another exemplary embodiment.

According to FIG. 4, a planar leadframe type carrier 114 made of a metal such as copper or aluminum is shown in a cross-sectional view.

As shown in FIG. 5, an identifier 110 is formed on a flat surface region of the carrier 114 as a protrusion 120 protruding beyond the planar upper main surface of the carrier 114. As shown in FIG. 5 as well, a functional structure 128 (such as an adhesion promoting layer or an adhesive layer) is formed simultaneously with the identifier 110. This can be accomplished by depositing and subsequently patterning (for instance by a lithography and etching procedure) a common layer which is separated into identifier 110 and functional structure 128 by the patterning. Thus, the functional structure 128 may be formed simultaneously, so that no additional effort is required for forming the identifier 110.

Referring to FIG. 6, an electronic component 102, such as a semiconductor chip, may then be mounted on the functional structure 128. Subsequently, the structure shown in FIG. 5 may be encapsulated by an encapsulant 106 (such as a mold compound), to thereby obtain package 100. The encapsulant 106 protects and electrically isolates the electronic component 102 and also the identifier 110. The identifier 110, which is of a protrusion type in the package 100 shown in FIG. 6, may then be inspected by X-ray inspection or the like.

What concerns the embodiment of FIG. 4 to FIG. 6, marking by providing a selective metal layer as identifier 110, a company logo (or another unique marking) can be formed during leadframe manufacturing without additional effort. Advantageously, it is possible to use a selective plating for bonding areas (i.e. die bonding and wire bonding). An advantage of the shown embodiment is to place identifier 110 inside encapsulant 106 of the package 100 for clear identification via X-ray analysis.

FIG. 7 to FIG. 9 illustrate cross-sectional views of structures obtained during manufacturing a package 100, shown in FIG. 9, according to another exemplary embodiment.

Referring to FIG. 7, the identifier 110 is formed as an indentation 116 or recess in a planar surface portion of the carrier 114. Advantageously, the method comprises, simultaneously with the formation of the recess type identifier 110, forming a functional structure 128 in the carrier 114, such as a mounting recess for simplifying subsequent mounting of an electronic component 102 (compare FIG. 9).

FIG. 7 shows that the carrier 114, such as a metal plate, is processed by etching using an etching mask (not shown) so as to form an indentation type identifier 110 and simultaneously an indentation type functional structure 128, such as an indentation for accommodating the electronic component 102. For instance, forming the indentation 116 may be carried out by patterning the carrier 114 with a laser treatment. Thus, lasermarking can also be used for forming the identifier 110, because it allows a clear identification of package 100.

FIG. 8 illustrates how a filling medium 118 is filled in the indentation 116, and additionally it is also applied to a surrounding portion of the indentation 116. Thus, a continuous electrically conductive layer 170 may be deposited on the entire upper main surface of the structure shown in FIG. 7, for instance by plating. By providing this additional material also in the indentation 116 of the identifier 110, removal of the so formed identifier 110 is very difficult and substantially impossible without destroying the package 100.

According to FIG. 9, the electronic component 102 is mounted in the recess constituting the functional structure 128. Thereafter, only the electronic component 102, not the identifier 110 is encapsulated by an encapsulant 106. Thus, the identifier 110 remains exposed and thus readable for a human user even after encapsulation.

FIG. 10 illustrates a cross-sectional view of a package 100 according to another exemplary embodiment. According to FIG. 10, the identifier 110 is composed of two additional bodies 122 attached to the carrier 114 and made of a material being different from a material of the carrier 114. For instance, it is possible to integrate one more additional materials (such as glass and/or ceramic) by attachment of corresponding bodies 122 onto the metallic carrier 114. It is also possible that one or more of the bodies 122 is embodied as additional metal element (in particular with different color as compared to the material of the carrier 114), to thereby simplify detection thereof.

Thus, one or more separate bodies 122, for instance metal bodies, glass bodies, etc. may be attached on a surface portion of the metal base plate of the carrier 114 so as to serve as identifier 110. For instance, the bodies 122 may have the shape of letters or numbers or of a logo. After having attached and connected the bodies 122 to the metal plate of the carrier 114, the bodies 122 may be encapsulated together with the electronic component 102. The encapsulated bodies 122 serving as identifier 110 may be detected for instance by X-ray analysis.

FIG. 11 illustrates a cross-sectional view of a package 100 according to still another exemplary embodiment.

In the embodiment of FIG. 11, the carrier 114 is embodied as a Direct Copper Bonding (DCB) substrate. Carrier 114 according to FIG. 11 is provided as a sandwich structure. For instance, the carrier 114 may have a central ceramic layer 172 being covered on both opposing main surfaces thereof with a respective electrically conductive layer 174, 176, for instance a copper layer or an aluminum layer. As furthermore shown in FIG. 11, an indentation 116 is formed in the multi-layer carrier 114 to thereby form an identifier 110. In the shown embodiment, the indentation 116 extends through the entire upper electrically conductive layer 174 and into the central ceramic layer 172. The indentation 116 may be filled with encapsulant material after encapsulating electronic component 102 and identifier 110.

FIG. 12 illustrates a three-dimensional view of packages 100 according to other exemplary embodiments. More specifically, FIG. 12 shows three different package types with correspondingly formed identifiers 110 on a respective carrier 114 and therefore illustrates that the concept of forming identifiers 110 on a metallic part of a carrier 114 can be realized with very different packaging architectures.

Figure 13:
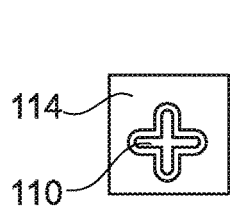
FIG. 13 to FIG. 21 illustrate plan views of identifiers of packages according to exemplary embodiments.
Figure 14:
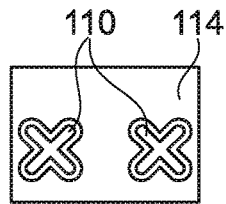
Figure 15:
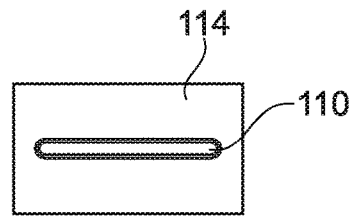
Figure 16:
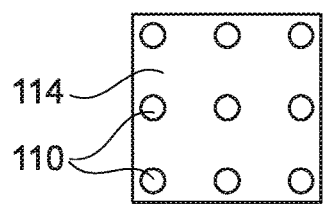
Figure 17:
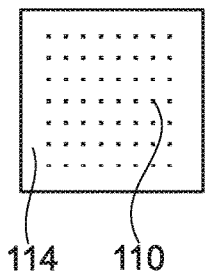
Figure 18:
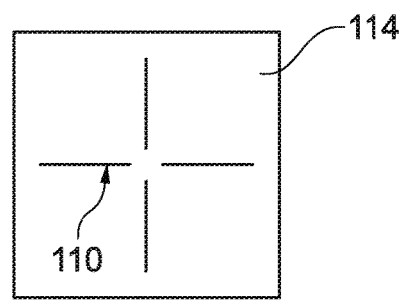
Figure 19:
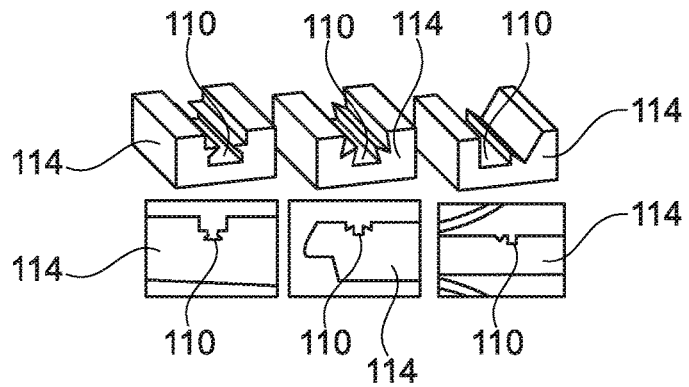
Figure 20:
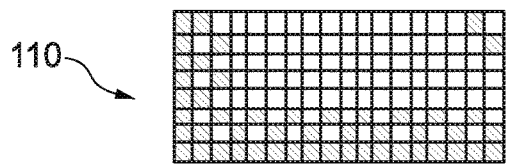
Figure 21:
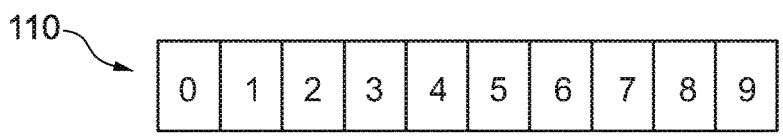

FIG. 13 to FIG. 21 illustrate plan views of identifiers 110 obtained during manufacturing a package 100 according to exemplary embodiments. Corresponding embodiments of identifiers 110 or parts thereof relate to dimples, micro dimples, grooves, crosses. Such structures may be formed through stamping or etching to create a logo design for forming an identifier 110. Thus, FIG. 13 to FIG. 21 show different shapes of identifiers 110 or parts thereof. In FIG. 13, the identifier 110 comprises a cross. In FIG. 14, the identifier 110 has X-shapes. In FIG. 15, the identifier 110 comprises an oblong slit. According to FIG. 16, the identifier 110 comprises an array of dots. In FIG. 17, the identifier 110 has a dot-like structure. In FIG. 18, the identifier has a cross-like structure with a lacking material portion in the center. In FIG. 19, identifiers 110 are shown which are formed as surface processes with complex three-dimensional profile, including undercuts. In FIG. 20, the identifier 110 is formed as an array of pixels being filled with materials having different optical properties. In FIG. 21, the identifier 110 is formed as a sequence of numbers.

It should be noted that the term "comprising" does not exclude other elements or features and the "a" or "an" does not exclude a plurality. Also elements described in association with different embodiments may be combined. It should also be noted that reference signs shall not be construed as limiting the scope of the claims. Moreover, the scope of the present application is not intended to be limited to the particular embodiments of the process, machine, manufacture, composition of matter, means, methods and steps described in the specification. Accordingly, the appended claims are intended to include within their scope such processes, machines, manufacture, compositions of matter, means, methods, or steps.

What is claimed is:

1. A package, comprising:
a carrier;
an electronic component mounted on the carrier;
an identifier indicative of an origin of the package and being formed on and/or in the carrier; and
an encapsulant encapsulating the identifier,
wherein the identifier comprises a plated layer, and
wherein the plated layer is on an entire upper main surface of the carrier.

2. The package according to claim 1, wherein the identifier is a three-dimensional structure.

3. The package according to claim 1, wherein the identifier comprises:
an indentation in the carrier; and
a filling medium at least partially filling the indentation and filling at least a surrounding portion of the carrier around the indentation.

4. The package according to claim 1, wherein the identifier comprises a protrusion protruding beyond the carrier.

5. The package according to claim 1, wherein the identifier comprises at least one body attached to the carrier, made of a material being different from a material of the carrier.

6. The package according to claim 1, wherein the carrier comprises a leadframe, comprising a die pad carrying the electronic component and a plurality of leads for electrically coupling the electronic component with an electronic periphery, wherein the identifier is formed on and/or in the die pad.

7. The package according to claim 1, wherein the carrier comprises at least one of the group consisting of a ceramic substrate, a stack composed of a central electrically insulating and thermally conductive layer covered on both opposing main surfaces by a respective electrically conductive layer, a Direct Copper Bonding substrate, and a Direct Aluminum Bonding substrate.

8. The package according to claim 1, wherein the identifier is formed on and/or in metallic material of the carrier.

9. The package according to claim 1, wherein the electronic component comprises at least one of the group consisting of a semiconductor chip, a power semiconductor chip, an active electronic device, a passive electronic device, a sensor, an actuator, and a microelectromechanical system.

10. The package according to claim 1, wherein the identifier is indicative of at least one of the group consisting of a manufacturer of the package, and a manufacturing lot to which the package belongs.

11. The package according to claim 1, wherein the identifier comprises at least one of the group consisting of an alphanumerical code, a logo, and a machine-readable code.

12. The package according to claim 1, wherein the identifier is arranged to be machine-readable from an exterior of the package.

13. The package according to claim 1, wherein the encapsulant at least partially encapsulates the electronic component.

14. The package according to claim 1, wherein the electronic component is mounted on the carrier by at least one of the group consisting of a solder structure, a sinter structure, a welding structure, and a glue structure.

15. The package according to claim 1, wherein the carrier is configured as a bulk structure for mechanically supporting the mounted electronic component and/or for electrically contacting the mounted electronic component.

16. A method of manufacturing a package, wherein the method comprises:
   mounting an electronic component on a carrier;
   forming an identifier indicative of an origin of the package on and/or in the carrier, wherein the identifier comprises a plated layer;
   forming the plated layer by plating an entire upper main surface of the carrier; and
   encapsulating the identifier with an encapsulant.

17. The method according to claim 16, comprising at least one of the following features:
   wherein the method comprises forming a functional structure on and/or in the carrier simultaneously with the forming of the identifier; or
   wherein the method comprises forming the identifier to simultaneously function as a functional structure.

18. The method according to claim 16, wherein forming the identifier comprises at least one of the group consisting of embossing the carrier, stamping the carrier, etching the carrier, laser scribing the carrier, depositing material on the carrier, plating material on the carrier, patterning the carrier and/or material on the carrier, and three-dimensionally printing on the carrier.

19. A method of determining an origin of a package according to claim 1, wherein the method comprises:
   detecting data from the identifier on and/or in the carrier; and
   identifying the origin of the package by evaluating the detected data, including by comparing the detected data with reference data stored in a database.

20. The method according to claim 19, wherein detecting comprises machine inspection by an X-ray detection device.

21. A package, comprising:
   a leadframe comprising a die pad and a plurality of leads;
   an electronic component mounted on the die pad; and
   an identifier indicative of an origin of the package formed on and/or in at least one of the plurality of leads,
   wherein the identifier comprises a plated layer, and
   wherein the plated layer is on an entire upper main surface of the leadframe.

* * * * *